United States Patent [19]
Koradia et al.

[11] Patent Number: 6,084,177
[45] Date of Patent: Jul. 4, 2000

[54] ELECTROMAGNETIC INTERFERENCE (EMI) SHIELD AND FASTENER APPARATUS AND METHOD

[75] Inventors: Amir Koradia, Palatine; Kisuck Chung, Bloomingdale; Daniel J. Lecinski, Arlington Heights; Susan I. English, Chicago, all of Ill.

[73] Assignee: 3Com Corporation, Rolling Meadows, Ill.

[21] Appl. No.: 09/013,407

[22] Filed: Jan. 26, 1998

[51] Int. Cl.$^7$ ..................................................... H05K 9/00
[52] U.S. Cl. ...................... 174/35 R; 361/683; 361/752; 361/816
[58] Field of Search ............................ 174/35 R, 35 GC; 361/800, 816, 818, 683, 752

[56] References Cited

U.S. PATENT DOCUMENTS

| | | | |
|---|---|---|---|
| 5,278,351 | 1/1994 | Herrick | 174/35 R |
| 5,808,237 | 9/1998 | Hancock | 174/35 R |

*Primary Examiner*—Kristina Kincaid
*Assistant Examiner*—Hung V Ngo
*Attorney, Agent, or Firm*—Baniak Nicholas Pine & Gannon

[57] ABSTRACT

An apparatus and method for shielding electromagnetic interference (EMI) and fastening housing members includes a clip for fastening to a first housing member including a length. The clip includes a plurality of longitudinally oriented openings formed therein and a plurality of dimples formed therein spaced along the length of the clip for engaging with a second housing member.

9 Claims, 2 Drawing Sheets

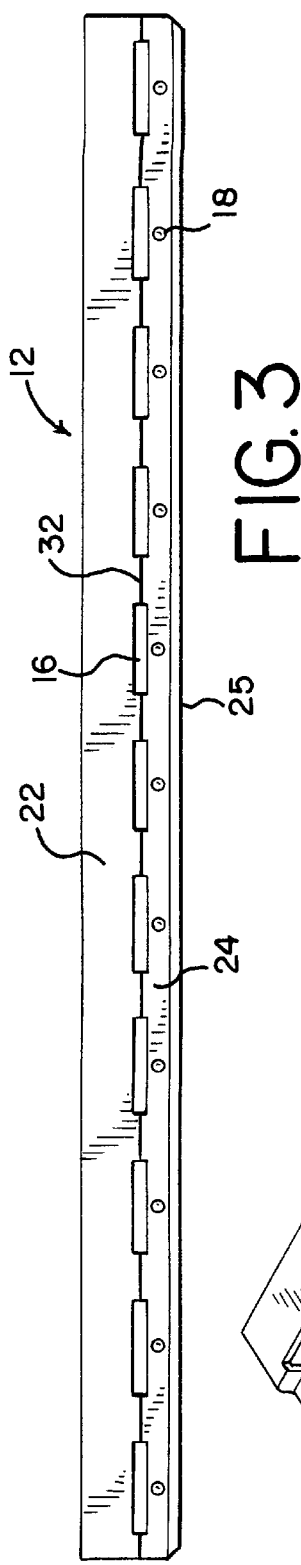
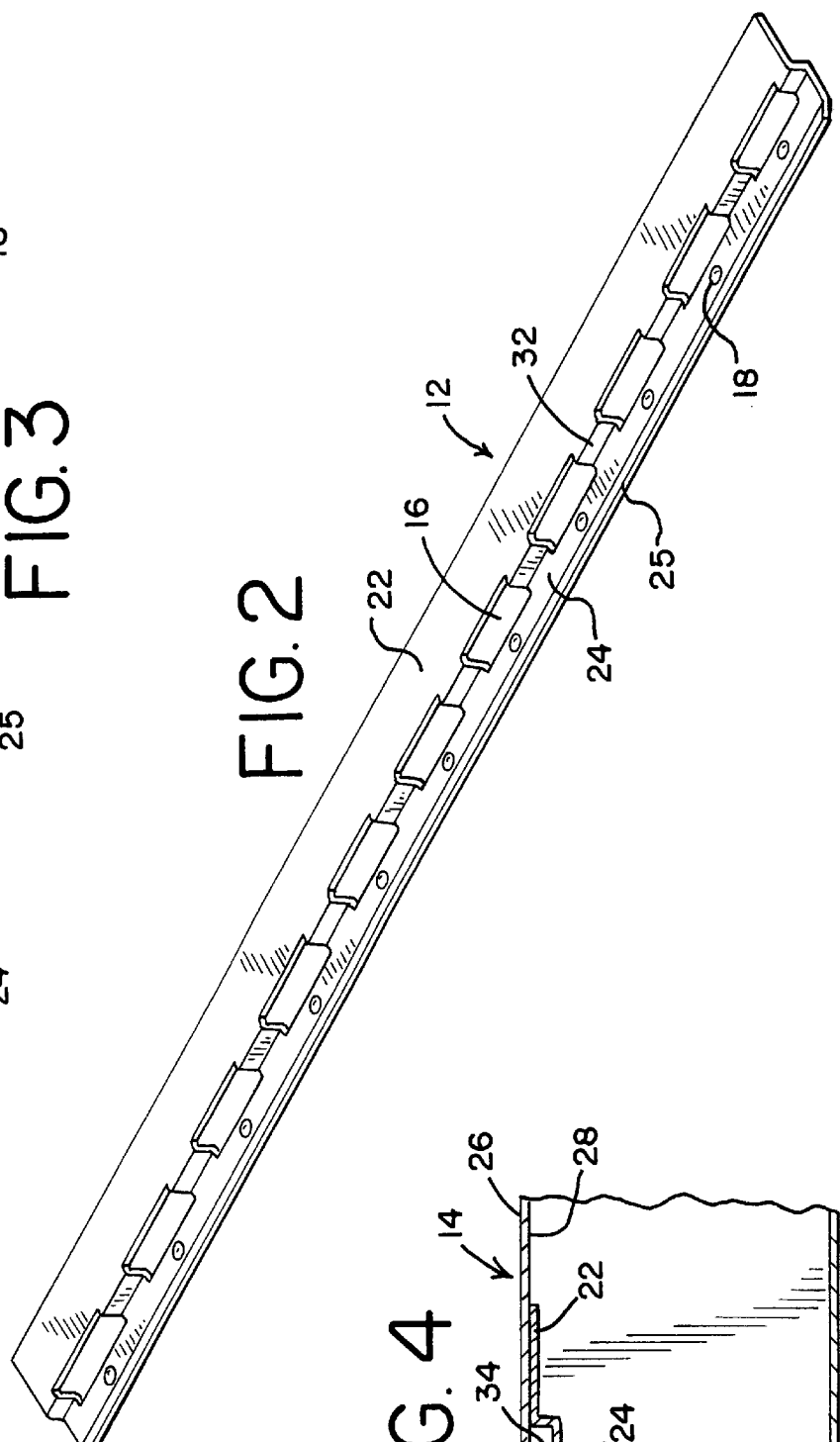
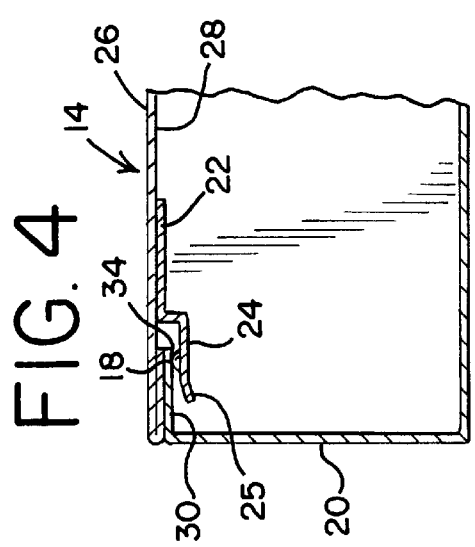

ELECTROMAGNETIC INTERFERENCE (EMI) SHIELD AND FASTENER APPARATUS AND METHOD

FIELD OF THE INVENTION

This invention relates generally to the field of electromagnetic interference (EMI) shields, and in particular, to an EMI shield which mechanically fastens two housing members together to reduce EMI emissions by preventing unacceptable levels of electromagnetic radiation from exiting the housing of an electronic device.

BACKGROUND OF THE INVENTION

Most electronic devices have a rigid housing to protect the internal electronic components and to prevent electromagnetic radiation generated by the components from exiting the housing. Excessive electromagnetic interference (EMI) is a widespread problem in many electronic devices, especially in the high speed network systems products. These electronic devices must meet very stringent emissions standards in the United States and in other foreign countries.

The housing for these types of electronic devices typically includes a top housing member and a bottom housing member which are mechanically fastened together by a plurality of screws. The screws are typically spaced several inches apart along the outer edge of the housing. There are certain disadvantages to this arrangement. First, screws which are placed several inches apart along the edge of the housing do not provide a continuous seal between the top housing member and the bottom housing member. This arrangement may allow unacceptable levels of electromagnetic radiation to exit the housing thereby creating excessive EMI. Second, there are high costs associated with the manufacture and assembly of electronic devices that utilize mechanical fasteners such as screws. In particular, several threaded screw holes must be formed around the perimeter of the housing during the manufacturing process. Moreover, each screw must be manually installed by an assembly worker which substantially increases the time required to assemble the device.

Accordingly, it would be desirable to have an EMI shield and fastener apparatus that overcomes the disadvantages described above, and to provide a simple and cost effective EMI shield and fastener apparatus.

SUMMARY OF THE INVENTION

One aspect of the invention provides an electromagnetic interference (EMI) shield and fastener apparatus. A clip for fastening to a first housing member includes a length. The clip includes a plurality of longitudinally oriented openings formed therein and a plurality of dimples formed therein spaced along the length of the clip for engaging with a second housing member. The dimples may have a curved contact surface. The longitudinally oriented openings may be rectangular in shape. The clip may have a rectangular shape and may be formed from a single piece of conductive material. The conductive material may be steel. The clip may be welded to the first housing member.

Another aspect of the invention provides an electromagnetic interference (EMI) shield and fastener apparatus. A clip includes a first longitudinal portion and a second longitudinal portion, the first longitudinal portion for fastening to a first housing member. A plurality of step portions are spaced along and between the first and second longitudinal portions. A plurality of dimples are spaced along the second longitudinal portion for contacting with a second housing member. The step portions may be oriented substantially perpendicular to the first and second longitudinal portions. The dimples may be equally spaced apart along the second longitudinal portion and between the step portions.

Another aspect of the invention provides an electromagnetic interference (EMI) shield and fastener apparatus. A top housing member and a bottom housing member is provided. The top housing member includes a top side including an inner surface. The bottom housing member includes a flange portion. A clip includes a first longitudinal portion and a second longitudinal portion. The first longitudinal portion is fastened to the inner surface of the top side of the top housing member. The second longitudinal portion includes a plurality dimples formed therein. A plurality of step portions spaced along and between the first and second longitudinal portions is provided. The flange portion is slidably engaged with the dimples.

Another aspect of the invention provides a method for shielding electromagnetic interference (EMI) and fastening housing members. A top housing member and a bottom housing member is provided. The top housing member includes a top side including an inner surface. The bottom housing member includes a flange portion. A clip including a first longitudinal portion and a second longitudinal portion is also provided. The first longitudinal portion is fastened to the inner surface of the top side of the top housing member. The second longitudinal portion includes a plurality dimples formed therein, and a plurality of step portions spaced along and between the first and second longitudinal portions. The flange portion of the bottom housing member is slidably engaged with the plurality of dimples. The second longitudinal portion is deflected. The plurality of dimples of the second longitudinal portion is biased against the flange portion to fasten the top housing member and the bottom housing member together and to prevent electromagnetic emissions from exiting between the top housing member and a bottom housing member.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which are defined by the appended claims and equivalents thereof.

BRIEF DESCRIPTION OF THE DRAWINGS

FIG. 2 is a perspective view of the clip of the embodiment of FIG. 1.

FIG. 3 is a top view of the clip of FIG. 2.

FIG. 4 is a partial cross-section of the embodiment of FIG. 1.

DETAILED DESCRIPTION OF THE PRESENTLY PREFERRED EMBODIMENTS

Figure 1:
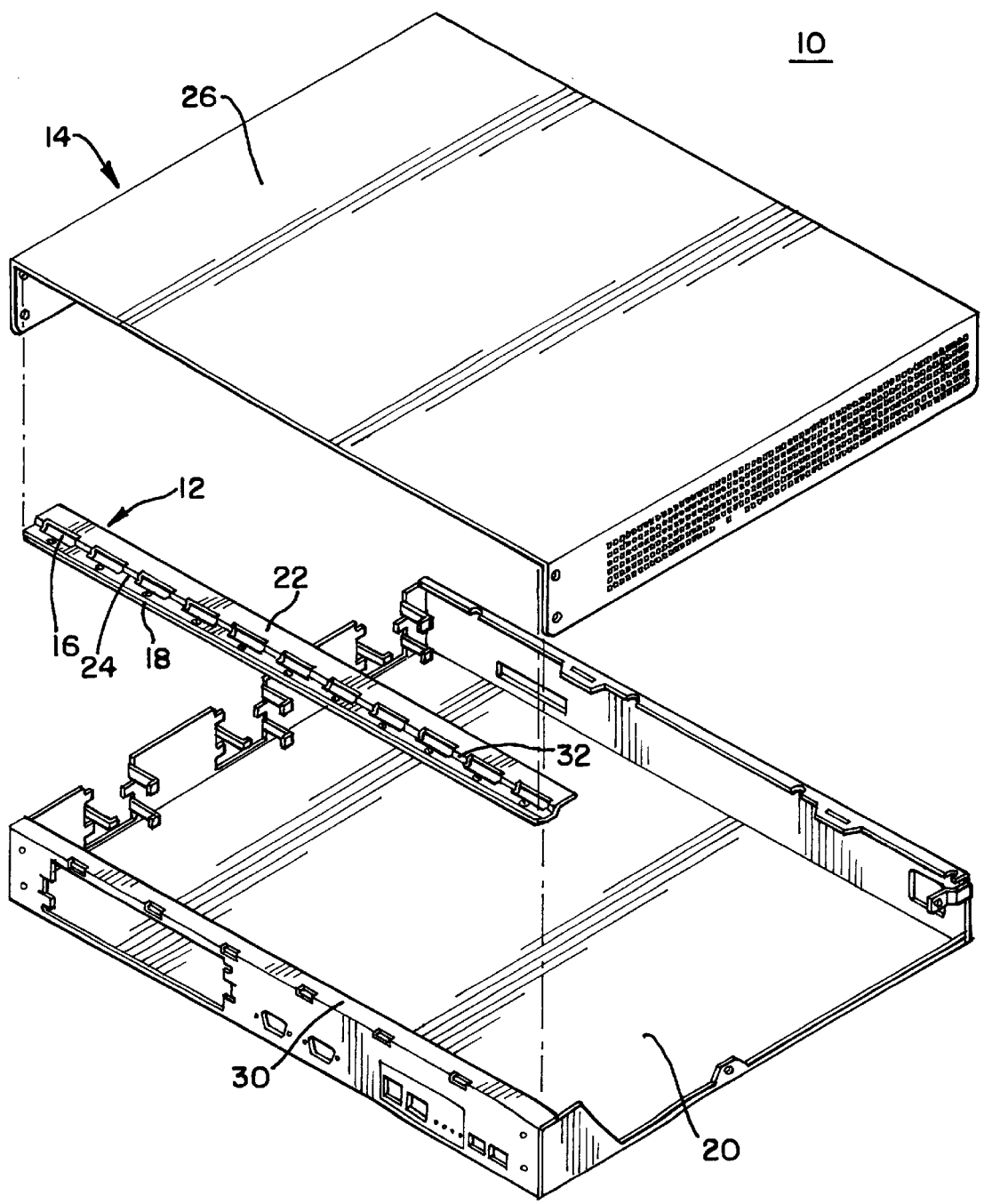
FIG. 1 is an exploded view of a preferred embodiment of an electromagnetic interference (EMI) shield and fastener apparatus which is made in accordance with the invention.

As shown in FIG. 1 a preferred embodiment of an electromagnetic interference (EMI) shield and fastener apparatus 10 includes a clip 12 for fastening to a first housing member 14 including a length. As shown in FIGS. 1–3, the clip 12 includes a plurality of longitudinally oriented openings 16 formed therein. The openings 16 are preferably rectangular in shape. The clip also includes a plurality of dimples 18 formed therein spaced along the length of the clip 12 for engaging with a second housing member 20.

As shown in FIGS. 1 and 4, the first housing member 14 is a top housing member and the second housing member 20 is a bottom housing member. The top housing member 14 includes a top side 26 including an inner surface 28. The bottom housing member 20 includes a flange portion 30.

The clip 12 preferably includes a first longitudinal portion 22 and a second longitudinal portion 24. The first longitudinal portion 22 is preferably fastened to a first housing member 14. As shown in FIG. 4, the first longitudinal portion 22 may preferably be fastened to the inner surface 28 of the top side 26 of the top housing member 14. The fastening may be accomplished by any conventional means such as, for example, spot welding. Other fastening means may be used including, for example, rivets or screws. The second longitudinal portion 24 includes a plurality of dimples 18 formed therein. As shown in FIGS. 2–4, the second longitudinal portion 24 may include a flange portion 25 oriented along the length of the second longitudinal portion 24 to guide the flange portion 30 of the bottom housing member 20 into contact with the dimples 18.

The clip 12 may preferably be formed from a single piece of conductive material. The conductive material may preferably be any suitable conductive material such as, for example, stainless steel. Other types of conductive material may be used, including copper. The clip 12 may preferably be rectangular in shape. The clip 12 may be configured in a wide variety of other shapes to conform with the shape of the top housing member 14 and the bottom housing member 20.

As shown in FIGS. 2–4, the plurality of dimples 18 may preferably be spaced along the second longitudinal portion 24 for contacting with the second housing member 20. The number of dimples 18 may vary depending on the particular application and the amount of friction that is desired between the dimples 18 and the flange portion 30 of the bottom housing member 20. As shown in FIGS. 2–3, the plurality of dimples 18 may preferably be equally spaced apart along the second longitudinal portion 24 and between a plurality of step portions 32. Alternatively, the dimples may be spaced along the second longitudinal portion 24 at varying intervals. The plurality of dimples 18 may preferably have a curved contact surface 34. Alternatively, the contact surface 34 may have a different shape depending on the particular application and the amount of friction desired between the contact surface 34 and the flange portion 30 of the bottom housing member 20.

As shown in FIGS. 2–3, the plurality of step portions 32 are spaced along and between the first longitudinal portion 22 and the second longitudinal portion 24. The step portions 32 may preferably be oriented substantially perpendicular to the first longitudinal portion 22 and the second longitudinal portion 24.

The apparatus shown in FIGS. 14 is used for shielding electromagnetic interference (EMI) and fastening housing members together. The flange portion 30 of the bottom housing member 20 is slidably engaged with the plurality of dimples 18. The second longitudinal portion 24 of the clip 12 is deflected and biases the plurality of dimples 18 of the second longitudinal portion 24 against the flange portion 30. One advantage of the present invention is that a continuous seal is formed between the top housing member 14 and the bottom housing member 20 which prevents electromagnetic radiation from exiting the housing. Moreover, this invention eliminates the need for screws or other mechanical fasteners to fasten the top housing member 14 and the bottom housing member 20 together.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An electromagnetic interference (EMI) shield and fastener apparatus comprising:

top housing member and a bottom housing member, the top housing member including a first side portion, a second side portion, a top wall, and a front edge, the top wall including an inner surface, the top wall and the front edge each extending from the first side portion to the second side portion, the bottom housing member including a bottom wall, a first bottom side portion, a second bottom side portion, and a front side portion extending upward from the bottom wall, the front side portion extending from the first bottom side portion to the second bottom side portion, a flange portion extending inward substantially perpendicular from the front side portion, the flange portion extending from the first bottom side portion to the second bottom side portion, and a clip including a first longitudinal portion and a second longitudinal portion, the clip including a plurality of longitudinally oriented openings formed therein, each of the plurality of longitudinally oriented openings extending from the first longitudinal portion to the second longitudinal portion, the first longitudinal portion fastened the inner surface of the top wall adjacent to the front edge of the top wall, a plurality of step portions spaced along and between the first and second longitudinal portions, the second longitudinal portion including a plurality of dimples formed therein for engaging with the flange portion, the plurality of dimples equally spaced apart along the second longitudinal portion and between the plurality of step portions, the first longitudinal portion and the second longitudinal portion each extending from the first side portion to the second side portion.

2. The apparatus of claim 1 wherein the clip is formed from a single piece of conductive material.

3. The apparatus of claim 2 wherein the conductive material is stainless steel.

4. The apparatus of claim 1 wherein the clip has a rectangular shape.

5. The apparatus of claim 1 wherein the clip is welded to the first housing member.

6. The apparatus of claim 1 wherein the longitudinally oriented openings are rectangular in shape.

7. The apparatus of claim 1 wherein the dimples have a curved contact surface.

8. The apparatus of claim 1 wherein the step portions are oriented substantially perpendicular to the first and second longitudinal portions.

9. A method for shielding electromagnetic interference (EMI) and fastening housing members comprising the steps of:

providing a top housing member and a bottom housing member, the top housing member including a first side portion, a second side portion, a top wall, and a front edge, the top wall including an inner surface, the top wall and the front edge each extending from the first side portion to the second side portion, the bottom housing member including a bottom wall, a first bottom side portion, a second bottom side portion, and a front side portion extending upward from the bottom wall, the front side portion extending from the first bottom side portion to the second bottom side portion, a flange portion extending inward substantially perpendicular from the front side portion, the flange portion extending from the first bottom side portion to the second bottom side portion, a clip including a first longitudinal portion and a second longitudinal portion, the clip including a plurality of longitudinally oriented openings formed therein, each of the plurality of longitudinally oriented openings extending from the first longitudinal portion to the second longitudinal portion, the first longitudinal portion fastened the inner surface of the top wall adjacent to the front edge of the top wall, a plurality of step portions spaced along and between the first and second longitudinal portions, the second longitudinal portion including a plurality of dimples formed therein for engaging with the flange portion, the plurality of dimples equally spaced apart along the second longitudinal portion and between the plurality of step portions, the first longitudinal portion and the second longitudinal portion each extending from the first side portion to the second side portion;

slidably engaging the flange portion with the plurality of dimples;

deflecting the second longitudinal portion; and biasing the plurality of dimples of the second longitudinal portion against the flange portion to fasten the top housing member and the bottom housing member together and to prevent electromagnetic emissions from exiting between the top housing member and a bottom housing member.

* * * * *